United States Patent
Gohara et al.

(10) Patent No.: US 10,214,109 B2
(45) Date of Patent: Feb. 26, 2019

(54) METHOD FOR MANUFACTURING COOLER FOR SEMICONDUCTOR-MODULE, COOLER FOR SEMICONDUCTOR-MODULE, SEMICONDUCTOR-MODULE AND ELECTRICALLY-DRIVEN VEHICLE

(71) Applicant: FUJI ELECTRIC CO., LTD., Kawasaki (JP)

(72) Inventors: Hiromichi Gohara, Kanagawa (JP); Nobuhide Arai, Kanagawa (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 560 days.

(21) Appl. No.: 14/895,789

(22) PCT Filed: Nov. 17, 2014

(86) PCT No.: PCT/JP2014/005756
§ 371 (c)(1),
(2) Date: Dec. 3, 2015

(87) PCT Pub. No.: WO2015/079643
PCT Pub. Date: Jun. 4, 2015

(65) Prior Publication Data
US 2016/0129792 A1  May 12, 2016

(30) Foreign Application Priority Data

Nov. 28, 2013 (JP) .................. 2013-246372

(51) Int. Cl.
*H05K 7/20* (2006.01)
*B60L 11/00* (2006.01)
(Continued)

(52) U.S. Cl.
CPC ............. *B60L 11/002* (2013.01); *B23P 15/26* (2013.01); *B60K 1/00* (2013.01); *H01L 23/3735* (2013.01);
(Continued)

(58) Field of Classification Search
None
See application file for complete search history.

(56) References Cited

U.S. PATENT DOCUMENTS 6,434,003 B1 *  8/2002  Roy .................. H05K 7/20927
165/104.22
7,876,561 B2 *  1/2011  Schnetzka ............. F25B 49/025
180/297

(Continued)

FOREIGN PATENT DOCUMENTS

JP    2001-352025    12/2001
JP    2006-295178    10/2006
(Continued)

OTHER PUBLICATIONS

International Notification of Transmittal of Translation of the International Preliminary Report on Patentability dated Jun. 9, 2016 in corresponding International Patent Application No. PCT/JP2014/005756.
(Continued)

*Primary Examiner* — Courtney Smith

(57) ABSTRACT

A cooler for a semiconductor-module includes: a heat sink which has an appearance of a cuboid structure to one side of which a flow rate control plate is fixed; a thermal radiation plate on an outer surface of which semiconductor devices are bonded; and a tray-shaped cooling jacket having: a coolant introduction channel; a coolant extraction channel extending in parallel to the coolant introduction channel; and a cooling channel provided between the coolant introduction and extraction channels. The heat sink is provided in the (Continued)

cooling channel of the cooling jacket so that the flow rate control plate extends in a boundary between the coolant extraction channel and the cooling channel, and channels provided for the heat sink extend orthogonally to the coolant introduction and extraction channels. The thermal radiation plate is fixed so as to close an opening the cooling jacket.

15 Claims, 6 Drawing Sheets

(51) Int. Cl.
*H01L 23/473* (2006.01)
*H01L 23/373* (2006.01)
*B23P 15/26* (2006.01)
*B60K 1/00* (2006.01)
*H01L 25/18* (2006.01)
*H01L 23/00* (2006.01)
*H01L 25/07* (2006.01)

(52) U.S. Cl.
CPC .......... *H01L 23/473* (2013.01); *H05K 7/205* (2013.01); *H05K 7/20927* (2013.01); *B60K 2001/003* (2013.01); *B60Y 2400/61* (2013.01); *H01L 24/29* (2013.01); *H01L 24/32* (2013.01); *H01L 24/48* (2013.01); *H01L 24/73* (2013.01); *H01L 25/072* (2013.01); *H01L 25/18* (2013.01); *H01L 2224/291* (2013.01); *H01L 2224/32225* (2013.01); *H01L 2224/48227* (2013.01); *H01L 2224/73265* (2013.01); *H01L 2924/00014* (2013.01); *H01L 2924/13055* (2013.01)

(56) References Cited

U.S. PATENT DOCUMENTS

| | | | | |
|---|---|---|---|---|
| 8,630,092 | B2* | 1/2014 | Kluge | H01L 23/473 174/252 |
| 8,902,591 | B2* | 12/2014 | Mou | H05K 7/20254 174/548 |
| 9,445,526 | B2* | 9/2016 | Zhou | H05K 7/20281 |
| 9,980,415 | B2* | 5/2018 | Zhou | H05K 7/20927 |
| 2006/0096738 | A1* | 5/2006 | Kang | F28F 3/022 165/80.4 |
| 2006/0225867 | A1 | 10/2006 | Park et al. | |
| 2009/0065178 | A1 | 5/2009 | Kasezawa et al. | |
| 2010/0090336 | A1 | 4/2010 | Yoshida et al. | |
| 2011/0108247 | A1* | 5/2011 | Kawaura | H01L 23/473 165/104.33 |
| 2012/0152498 | A1* | 6/2012 | Lyon | F28D 15/00 165/104.31 |
| 2014/0239486 | A1 | 8/2014 | Gohara et al. | |
| 2014/0252590 | A1 | 9/2014 | Gohara et al. | |
| 2014/0268571 | A1* | 9/2014 | Kang | H05K 7/20 361/699 |

FOREIGN PATENT DOCUMENTS

| | | |
|---|---|---|
| JP | 2007-281504 | 10/2007 |
| JP | 2008-172014 | 7/2008 |
| JP | 2010-87016 | 4/2010 |
| JP | 2010-203694 | 9/2010 |
| JP | 2011-40778 | 2/2011 |
| JP | 2011-108683 | 6/2011 |
| JP | 2011-114206 | 6/2011 |
| JP | 2011-134979 | 7/2011 |
| JP | 2012-37136 | 2/2012 |
| JP | 2012-60002 | 3/2012 |
| JP | 2012-156322 | 8/2012 |
| JP | 2013-215080 | 10/2013 |
| WO | WO 2013/054615 A1 | 4/2013 |
| WO | WO 2013/054887 | 4/2013 |

OTHER PUBLICATIONS

International Preliminary Report on Patentability dated May 31, 2016 in corresponding International Patent Application No. PCT/JP2014/005756.

International Search report dated Feb. 17, 2015, in corresponding International Application No. PCT/JP2014/005756.

* cited by examiner

METHOD FOR MANUFACTURING COOLER FOR SEMICONDUCTOR-MODULE, COOLER FOR SEMICONDUCTOR-MODULE, SEMICONDUCTOR-MODULE AND ELECTRICALLY-DRIVEN VEHICLE

CROSS-REFERENCE TO RELATED APPLICATIONS

This application is a U.S. National Stage Application, which claims the benefit under 35 U.S.C. § 371 of PCT International Patent Application No. PCT/JP2014/005756, filed Nov. 17, 2014, which claims the foreign priority benefit under 35 U.S.C. § 119 of Japanese Patent Application No. 2013-246372, filed Nov. 28, 2013, the contents of which are incorporated herein by reference.

TECHNICAL FIELD

The present invention relates to a method for manufacturing a semiconductor-module cooler which cools semiconductor devices, a semiconductor-module cooler, a semiconductor-module cooling semiconductor devices arranged on the outer surface of the cooler, and an electrically-driven vehicle.

BACKGROUND ART

In power converters adapted for hybrid vehicles, electric vehicles, and the like, semiconductor-modules are widely used. Such semiconductor-modules, which implement controllers for energy saving, are provided with power semiconductor devices configured to control high current. Typical power semiconductor devices generate heat while controlling high current. The heat generated by power semiconductor devices increases as the power converters are miniaturized smaller and smaller, or outputs of the power converters increase higher and higher. Accordingly, semiconductor-modules including a plurality of power semiconductor devices have a serious cooling problem.

With the goal of improving the cooling efficiency of semiconductor-modules, liquid-cooled devices have been used. The liquid-cooled devices are developed with various manners such as a scheme of increasing the flow rate of the coolant to improve the cooling efficiency, a scheme of designing fins (cooling bodies) for radiation to have a shape that can provide a high heat transfer coefficient, and a scheme of employing fins made of a higher thermal conductivity material (Patent Literatures (PTLs) 1 to 8, for example).

However, when the flow rate of the coolant in the cooling device is increased or a complex fin shape providing high heat transfer rate is employed, the pressure loss of the coolant increases in the cooling device, thus increasing the load on a cooling pump that circulates the coolant. As for a cooling device that uses a plurality of heat sinks to cool a number of power semiconductor devices in particular, the pressure loss is predominantly increased by the channel configuration in which a plurality of channels are connected in series. Ideally, to decrease the pressure loss, the cooling device has a configuration that can provide a higher cooling efficiency at a low flow rate of the coolant. For example, it is only necessary to employ a fin material having a higher thermal conductivity. However, the employment of a fin material having a high thermal conductivity could increase the entire cost of the cooling device.

In order to decrease the pressure loss while keeping the cooling performance, in some conventionally proposed cooling devices, a coolant introduction channel for introducing a coolant and a coolant extraction channel for extracting the coolant are arranged in parallel to each other, and a plurality of heat sinks are arranged in an area between the coolant introduction and extraction channels so as to extend in a direction that the coolant flows, the direction being substantially orthogonal to the coolant introduction and extraction channels (see PTLs 9 to 13, for example).

Herein, in the case of PTL 13, in the coolant extraction channel extending toward a coolant outlet, a flow rate control plate is provided in parallel to a one side-surface of the heat sink so as to be spaced from the heat sink. The flow rate of the coolant flowing from the coolant introduction channel to the other side-surface of the heat sink can be thereby controlled. It is therefore possible to effectively cool semiconductor devices provided on the outer surface of the cooler, thus enabling stable operation of the semiconductor devices.

CITATION LIST

Patent Literature

[PTL1] JP 2011-114206A
[PTL2] JP 2007-281504A
[PTL3] JP 2012-37136A
[PTL4] JP 2010-87016A
[PTL5] JP 2012-156322A
[PTL6] JP 2012-60002A
[PTL7] JP 2011-108683A
[PTL8] JP 2008-172014A
[PTL9] JP 2001-352025A (FIGS. 2 and 3)
[PTL10] JP 2010-203694A
[PTL11] JP 2011-134979A
[PTL12] JP 2006-295178A
[PTL13] WO2013/054615A1 (FIGS. 11 to 15)

SUMMARY OF INVENTION

Technical Problem

In PTL 13 described above, the flow rate control plate controlling the flow rate of the coolant is fixed at a position of a water jacket where the coolant extraction channel is formed, and the positioning accuracy of the flow rate control plate with respect to the heat sink tends to lower. Moreover, the cooling device of PTL 13 needs to be manufactured through many assembly steps and has a manufacturing cost problem.

Furthermore, the conventional semiconductor-module coolers have a problem that the weight of the cooling devices cooling a number of power semiconductor devices tend to be heavy.

Accordingly, an object of the present invention is to provide a method for manufacturing a semiconductor-module cooler that provides a stable cooling performance and decreases the manufacturing cost and to provide a light-weight and robust semiconductor-module cooler that provide a stable cooling performance, a semiconductor-module, and an electrically-drive vehicle.

Solution to Problem

In order to achieve the aforementioned object, a method for manufacturing a cooler for a semiconductor-module according to an aspect of the present invention is a method for manufacturing a cooler for a semiconductor-module which includes: a heat sink having an appearance of a cuboid structure; a thermal radiation plate on the outer surface of which a semiconductor device is bonded; and a tray-shaped cooling jacket including: a coolant introduction channel to introduce a coolant through a coolant inlet portion; a coolant extraction channel to extract the coolant to a coolant outlet portion, the coolant extraction channel extending in parallel to the coolant introduction channel; and a cooling channel provided between the coolant introduction and extraction channels. The method includes the steps of: fixing a flow rate control plate to a one side of the heat sink; arranging the heat sink in the cooling channel of the cooling jacket so that the flow rate control plate extends in the boundary between the coolant extraction channel and cooling channel, and a plurality of channels provided for the heat sink extend orthogonally to the coolant introduction and extraction channels; and bonding the thermal radiation plate by brazing to close an opening the cooling jacket.

Moreover, a cooler for a semiconductor-module according to an aspect of the present invention includes: a heat sink which has an appearance of a cuboid structure and a one side of which is fixed to a flow rate control plate; a thermal radiation plate, to the outer surface of which a semiconductor device is bonded; and a tray-shaped cooling jacket including: a coolant introduction channel to introduce a coolant through a coolant inlet portion; a coolant extraction channel to extract the coolant to a coolant outlet portion, the coolant extraction channel extending in parallel to the coolant introduction channel; and a cooling channel provided between the coolant introduction and extraction channels. The heat sink is arranged in the cooling channel of the cooling jacket so that the flow rate control plate extends in the boundary between the coolant extraction channel and the cooling channel, and a plurality of channels provided for the heat sink extend orthogonally to the coolant introduction and extraction channels; the thermal radiation plate is fixed so as to close an opening of the cooling jacket; and upper and lower surfaces of the heat sink that face the inner surface of the cooling jacket and the inner surface of the thermal radiation plate respectively contact to the inner surfaces of the cooling jacket and thermal radiation plate.

Furthermore, a semiconductor-module according to an aspect of the present invention includes: a cooler which is externally supplied with a coolant to cool a semiconductor device provided on the outer surface of the cooler. The cooler includes: a heat sink which has an appearance of a cuboid structure and a one side of which is fixed to a flow rate control plate; a thermal radiation plate, to the outer surface of which the semiconductor device is bonded; and a tray-shaped cooling jacket including: a coolant introduction channel to introduce a coolant through a coolant inlet portion; a coolant extraction channel to extract the coolant to a coolant outlet portion, the coolant extraction channel extending in parallel to the coolant introduction channel; and a cooling channel provided between the coolant introduction and extraction channels. The heat sink is arranged in the cooling channel of the cooling jacket so that the flow rate control plate extends in the boundary between the coolant extraction channel and the cooling channel, and a plurality of channels provided for the heat sink extend orthogonally to the coolant introduction and extraction channels; the thermal radiation plate is fixed so as to close an opening of the cooling jacket; and upper and lower surfaces of the heat sink that face the inner surface of the cooling jacket and the inner surface of the thermal radiation plate respectively contact to the inner surfaces of the cooling jacket and thermal radiation plate.

Still furthermore, an electrically-driven vehicle according to an aspect of the present invention includes: the above-described semiconductor-module; a motor driven by electric power provided by the semiconductor-module; a central processing unit controlling the semiconductor-module; a pump transporting a coolant to cool the semiconductor-module; a heat exchanger cooling the coolant; and a tube forming a coolant path, the semiconductor-module, the pump, and the heat exchanger in a closed loop, which are integrated with the cooler.

Advantageous Effect of Invention

According to the method for manufacturing a semiconductor-module cooler of the present invention, the method includes the step of fixing the flow rate control plate to the heat sink. Accordingly, the number of parts can be decreased, and the semiconductor-module cooler can be manufactured in a simple manufacturing process, thus decreasing the manufacturing cost. Moreover, the flow rate control plate is located in the boundary between the cooling channel and the coolant extraction channel. This prevents the coolant from flowing thorough a certain channel of the heat sink with a higher flow rate, that is, prevents uneven flow of the coolant to provide a stable cooling capability.

According to the semiconductor-module cooler and semiconductor-module of the present invention, the surfaces of the heat sink that face the inner surface of the cooling jacket and the inner surface of the radiator contact to the inner surfaces of the cooling jacket and the thermal radiation plate. The semiconductor-module cooler and semiconductor-module have high flexural rigidity and does not deform easily even if the module is exposed to vibration externally transmitted. The semiconductor-module cooler and semiconductor-module can be therefore robust. Even if the thermal radiation plate and cooling jacket are made thin, the surfaces of the heat sink contact to the thermal radiation plate and cooling jacket to keep the robust structure. Accordingly, the cooler and module can be decreased in weight. Furthermore, the thermal radiation plate and cooling jacket made thinner have smaller thermal resistance and more excellent heat radiation, further providing a higher cooling capability.

Still furthermore, according to the electrically-driven vehicle of the present invention, the semiconductor-module which is compact and has high rigidity is resistant to vibration due to movement of the electrically-driven vehicle.

DESCRIPTION OF EMBODIMENTS

Hereinafter, an embodiment for carrying out the present invention will be described in detail with reference to the drawings.

Figure 1:
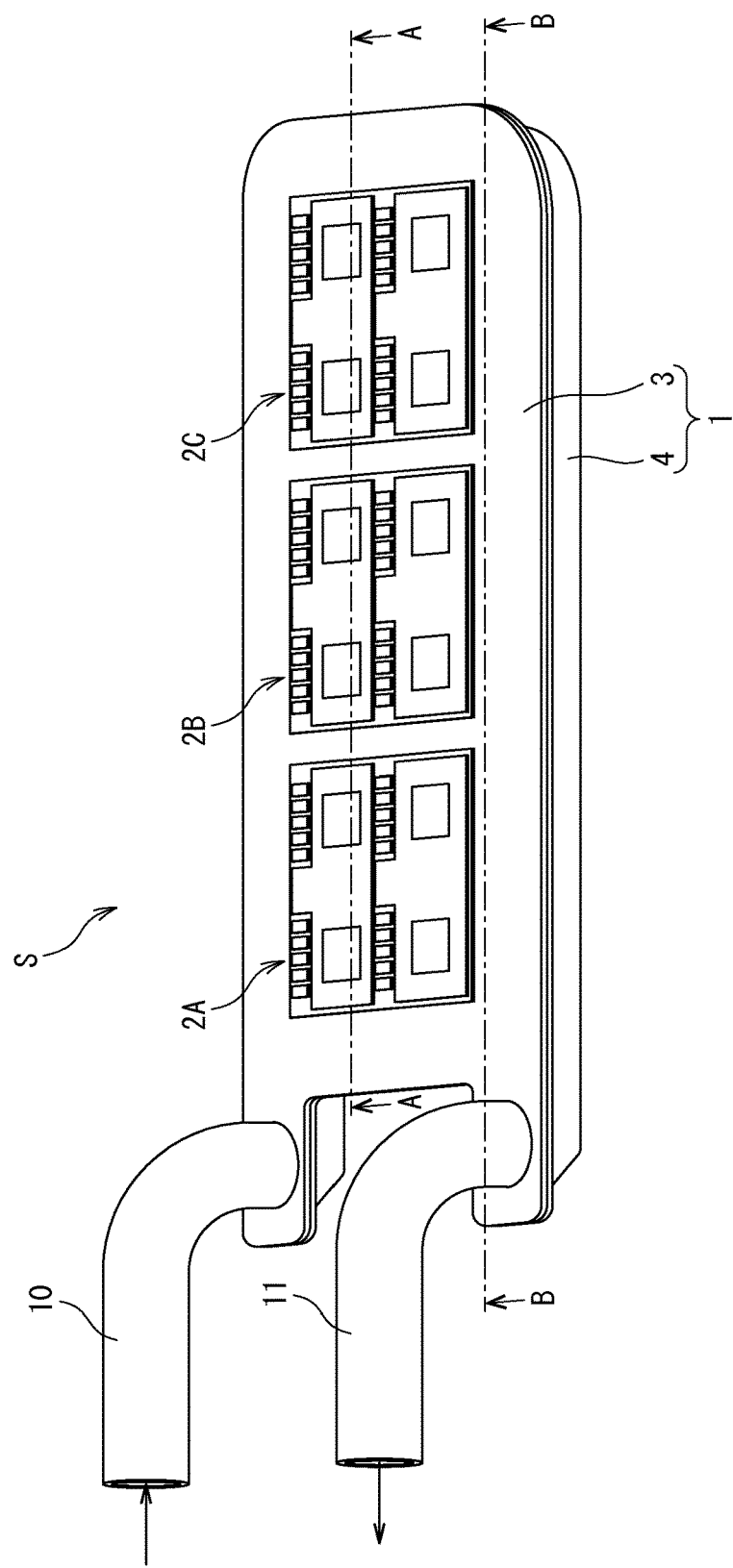
FIG. 1 is an appearance perspective view illustrating an example of a semiconductor-module according to an embodiment of the present invention.
Figure 2:
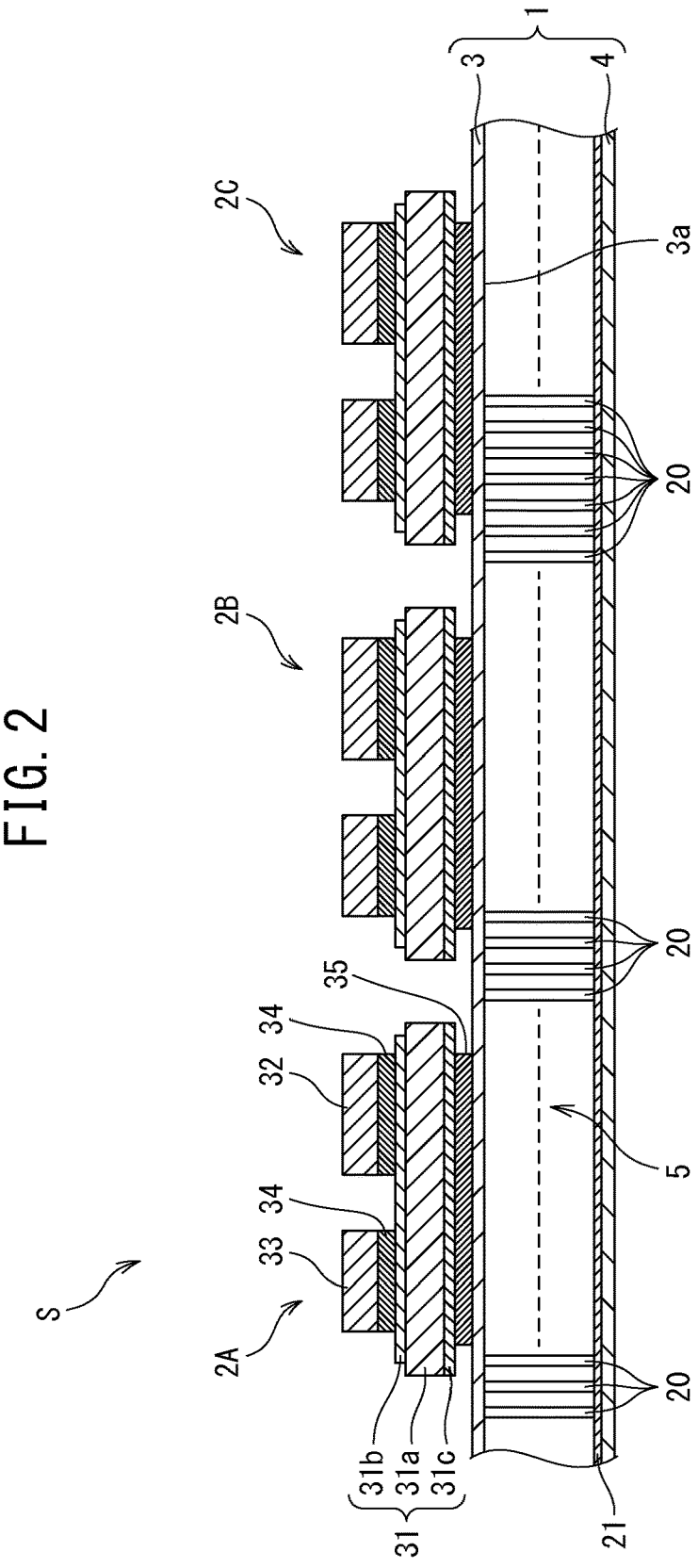
FIG. 2 is a cross-sectional view of the semiconductor-module illustrated in FIG. 1, taken along an A-A line and seen in the direction of the arrows A.
Figure 3:
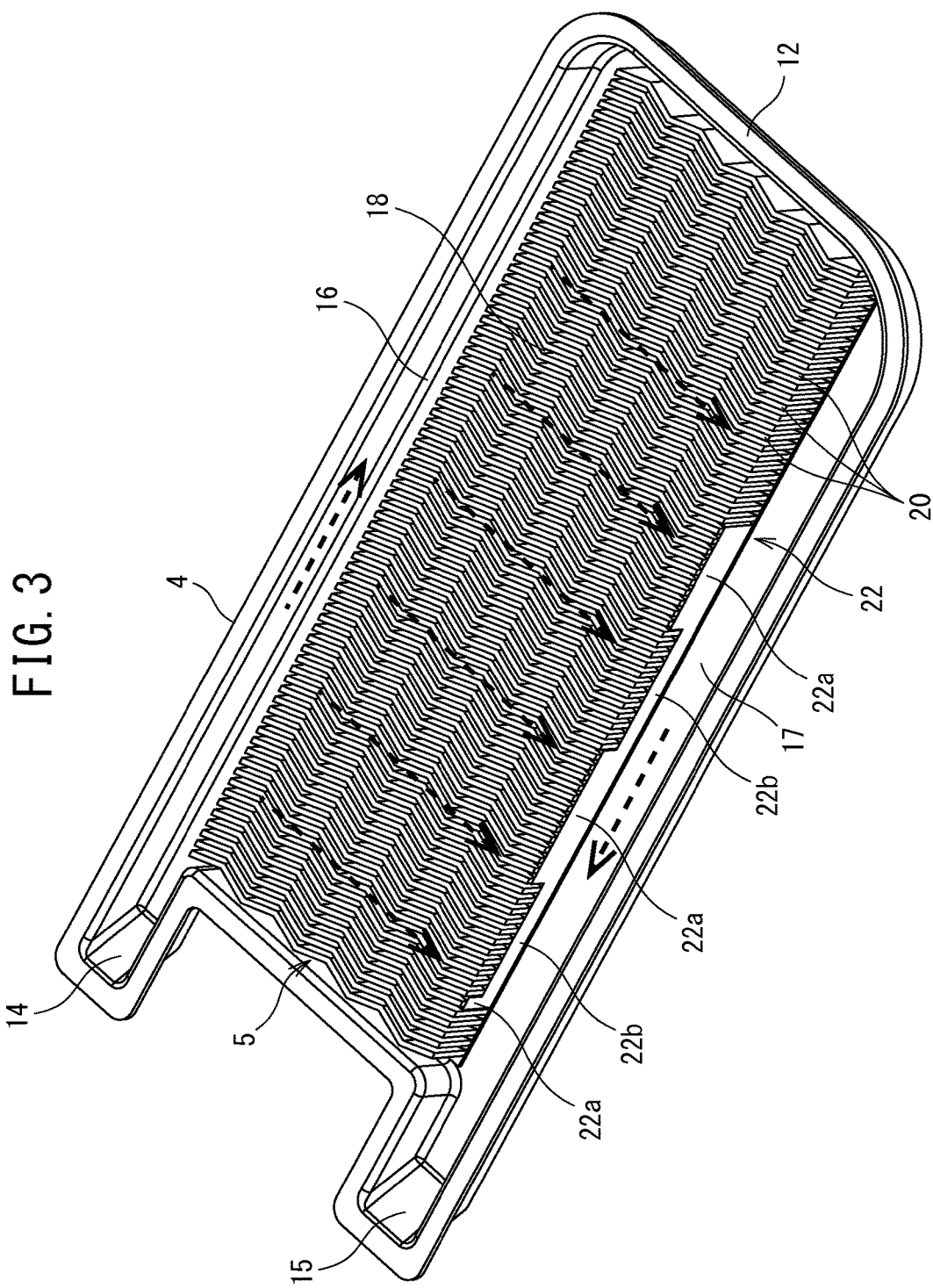
FIG. 3 is a view illustrating the inside of a cooler implementing the semiconductor-module.
Figure 4:
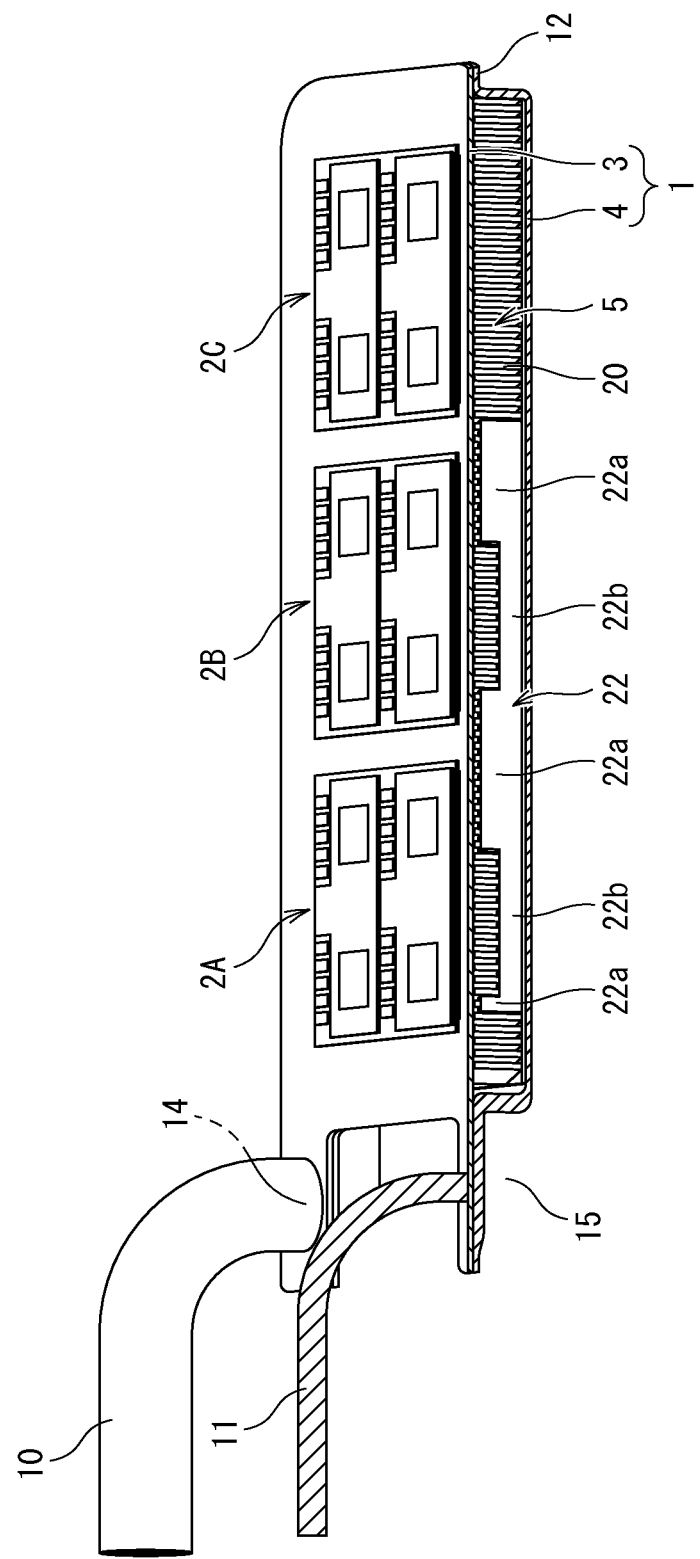
FIG. 4 is a cross-sectional view of the semiconductor-module illustrated in FIG. 1, taken along a B-B line and seen in the direction of the arrows B.
Figure 5:
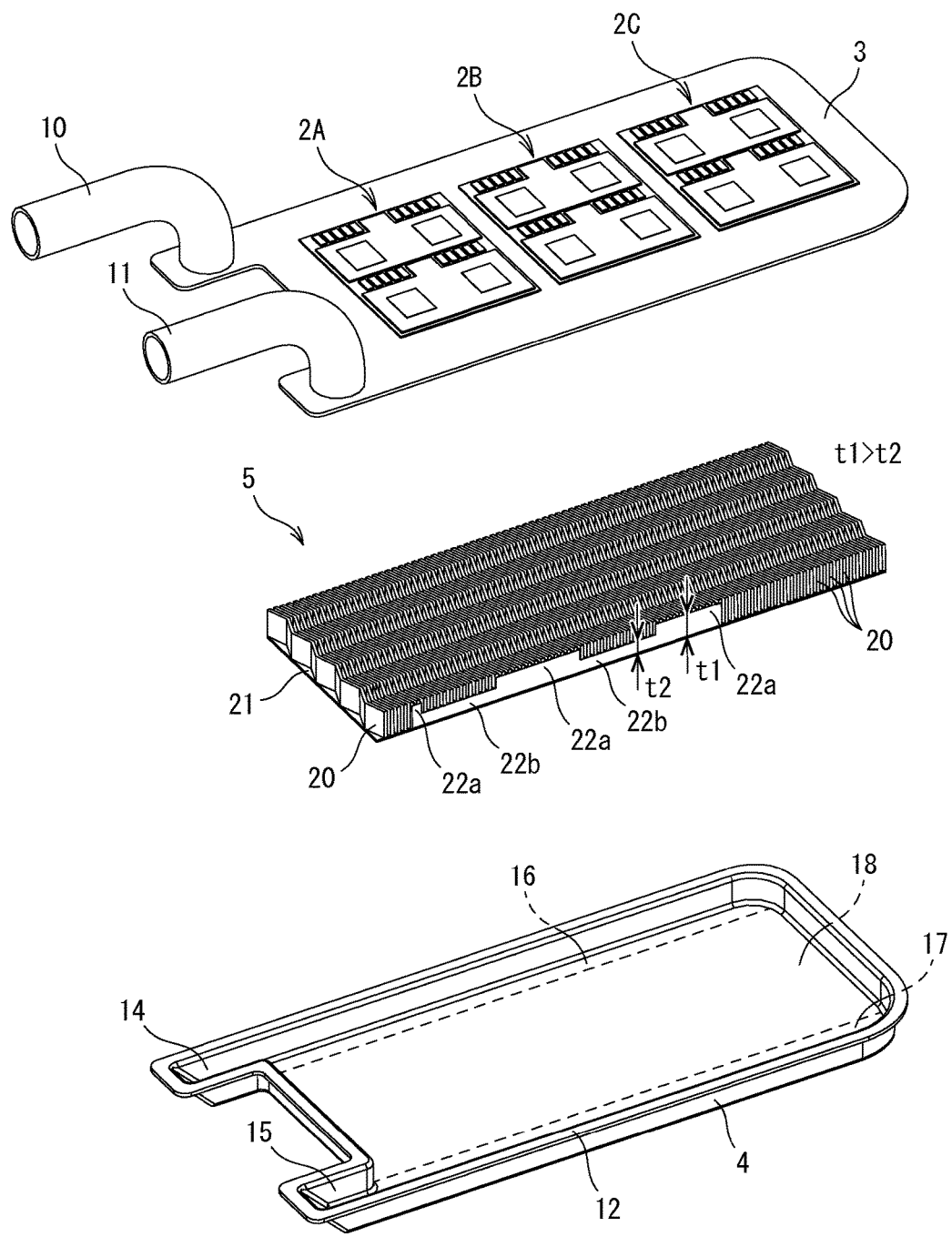
FIG. 5 is an exploded perspective view of members implementing the semiconductor-module according to the embodiment of the present invention.
Figure 6:
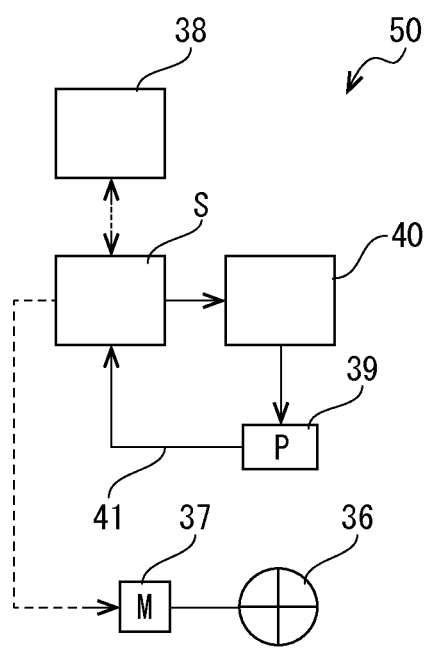
FIG. 6 is a schematic configuration diagram of an electrically-driven vehicle according to the embodiment of the present invention.

FIG. 1 is an appearance perspective view illustrating an example of a semiconductor-module according to an embodiment of the present invention, FIG. 2 is a cross-sectional view of the semiconductor-module illustrated in FIG. 1, taken along an A-A line and seen in the direction of the arrows A, FIG. 3 is a view illustrating the inside of a cooler integrated with the semiconductor-module, FIG. 4 is a cross-sectional view of the semiconductor-module illustrated in FIG. 1, taken along a B-B line and seen in the direction of the arrows B, FIG. 5 is an exploded perspective view of members implementing the semiconductor-module and FIG. 6 is a schematic configuration diagram of an electrically-driven vehicle according to the embodiment of the present invention.

As illustrated in FIGS. 1 and 2, a semiconductor-module S includes a cooler 1 and circuit-element sections 2A to 2C provided on the outer surface of the cooler 1.

As illustrated in FIGS. 1 and 2, the cooler 1 includes a thermal radiation plate 3, on the outer surface of which the plurality of circuit-element sections 2A to 2C are provided, a cooling jacket 4 bonded to the thermal radiation plate 3 by brazing and a fin unit 5 as a heat sink housed between the thermal radiation plate 3 and cooling jacket 4.

The thermal radiation plate 3 is a substantially rectangular plate material as illustrated in FIG. 1. To a one end of the thermal radiation plate 3 in the longitudinal direction, a coolant inlet pipe 10 and a coolant outlet pipe 11 are connected. The coolant inlet pipe 10 and the coolant outlet pipe 11 are separated from each other in the short-side direction.

As illustrated in FIG. 3, the cooling jacket 4 is a substantially cuboid tray-shape, which has a joint face 12 running around the entire outer circumference, and the joint face 12 surrounds an opening of the tray-shape. The joint face 12 is supposed to be bonded to the thermal radiation plate 3. The cooling jacket 4 is provided with a coolant inlet portion 14, a coolant outlet portion 15, a coolant introduction channel 16, a coolant extraction channel 17, and a cooling channel 18.

The coolant inlet portion 14 is a portion through which the coolant is introduced into the cooling jacket 4. The coolant outlet portion 15 is a portion through which the coolant is extracted from the inside of the cooling jacket 4 to the outside. The coolant inlet portion 14 and the coolant outlet portion 15 are provided at a one end of the coolant jacket 4 in the longitudinal direction so as to be separated from each other along the short-side direction.

The coolant introduction channel 16, as a first channel extending in the direction that the coolant flows into the cooler 4, communicates with the coolant inlet portion 14 and extends from a one end to the other end of the coolant jacket 14 in the longitudinal direction.

The coolant extraction channel 17, as a second channel extended to the coolant outlet portion 15, is provided linearly in substantially parallel to the coolant introduction channel 16 and extends from the other end to the end of the coolant jacket 4 in the longitudinal direction.

The coolant channel 18 is provided as a third channel between the coolant introduction channel 16 and the coolant extraction channel 17 and communicates with the coolant introduction channel 16 and the coolant extraction channel 17. In other words, the cooling channel 18 extends in the direction orthogonal to the direction that the coolant introduction channel 16 extends and the direction that the coolant extraction channel 17 extends.

In the coolant channel 18, fins of the above-described fin unit 5 are located. The coolant flows through each of the channels defined by the fins of the fin unit 5.

As illustrated in FIGS. 3 and 5, the fin unit 5 includes a number of fins 20, a unit base 21, and a flow rate control plate 22. Each fin 20 is bent to an identical corrugated profile. The fins 20 are supported on a fin supporting member (not shown) and are arranged at predetermined intervals in the thickness direction to create the appearance of a cuboid structure. The unit base 21 is made of a rectangular plate material fixed at the lower edges of the number of fins 20. The flow rate control plate 22 is bonded by brazing to the lower edges of the number of fins 20, which are arranged to create the appearance of the cuboid structure, so as to extend along one of the long sides of the cuboid structure.

The flow rate control plate 22 includes flow rate decreasing sections 22a and flow rate increasing sections 22b. Each flow rate decreasing section 22a stands from the lower edges of the fins 20 to a height t1 slightly below the upper edges of the fins 20. Each flow rate increasing section 22b has a height t2 measured from the lower edges of the fins 20, the height t2 being lower than the height t1 of the flow rate decreasing section 22a.

As illustrated in FIG. 3, the fin unit 5 is placed in an area of the cooling jacket 4 corresponding to the site of the cooling channel 18 by brazing to the unit base 21.

When the fin unit 5 is placed in the site of the cooling channel 18, the channels formed between the number of fins 20 of the fin unit 5 communicate with the coolant introduction channel 16 and the coolant extraction channel 17 provided for the cooling jacket 4 so that the direction of the channels are substantially orthogonal to the direction of the coolant introduction channel 16 and the coolant extraction channel 17.

The flow rate control plate 22 of the fin unit 5 is implemented by a single plate member extending in the boundary between the coolant extraction channel 17 and the end of the cooling channel 18. The flow rate control plate 22 is provided in the side close to the coolant outlet portion 15 and is not provided in the far side distant from the coolant outlet portion 15.

The lower surface of the thermal radiation plate 3 is bonded by brazing to the joint face 12 provided for the entire circumference around the opening of the cooling jacket 4 with the fin unit 5 bonded to the cooling channel 18. A coolant inlet pipe 10 connected to the thermal radiation plate 3 thereby communicates with the coolant inlet portion 14, and a coolant outlet pipe 11 communicates with the coolant outlet portion 15. Moreover, the fin unit 5 is sealed within the cooling jacket 4 and thermal radiation plate 3 which are integrated. The cooler 1 is thus formed.

In the cooler 1, as illustrated in FIG. 2, all of the fins 20 of the fin unit 5 contact to an inner surface 3a of the thermal radiation plate 3 and the bottom surface of the cooling jacket 4, interposing the unit base 21 between the fin unit 5 and the cooling jacket 4.

The thermal radiation plate 3 and cooling jacket 4, which implement the cooler 1, are made of metallic materials such as aluminum, aluminum alloy, copper, and copper alloy, for example. The fins 20, the unit base 21, and the flow rate control plate 22, which implement the fin unit 5, are made of metallic materials such as aluminum, aluminum alloy, copper, and copper alloy in a similar manner to the thermal radiation plate 3 and cooling jacket 4, for example.

On the other hand, each of the circuit-element sections 2A to 2C includes totally four elements including two semiconductor devices 32 and two semiconductor devices 33, which are different kinds of power semiconductor devices, on a substrate 31 as illustrated in FIG. 2. The substrate 31 includes an insulating substrate 31a and conductor patterns 31b and 31c delineated on the respective sides of the substrate 31a.

The insulating substrate 31a of the substrate 31 can be implemented by of a ceramic substrate made of aluminum nitride, aluminum oxide, or the like, for example. The conductor patterns 31b and 31c on the insulating substrate 31a can be made of metal such as copper or aluminum (copper foil, for example).

The semiconductor devices 32 and 33 are bonded to the conductor pattern 31b side of the substrate 31 with a joint layer 34 implemented by solder or the like and are electrically connected to the conductor pattern 31b directly or through wire (not shown). The other conductor pattern 31c side of the substrate 31, which mounts the semiconductor devices 32 and 33 on the substrate 31, is bonded to the thermal radiation plate 3 with a joint layer 35 interposed between the conductor pattern 31c and the head radiation plate 3.

The substrate 31 and the semiconductor devices 32 and 33 mounted on the substrate 31 are thermally connected to the cooler 1. On the exposed surfaces of the conductor patterns 31b and 31c and the surfaces of wires electrically connecting the semiconductor devices 32 and 33 to the conductor pattern 31b, protecting layers to protect the surfaces from contamination, corrosion, external force, or the like may be formed by nickel plating or the like.

In the semiconductor-module S of the embodiment, the three circuit-element sections 2A to 2C establish an inverter circuit. The inverter circuit includes a bridge circuit encompassing the semiconductor devices 33 implemented by IGBTs and semiconductor devices 32 implemented by FWDs with respect to each of three U-, V-, and W-phases. The inverter circuit controls switching operation of the semiconductor devices 33, converting DC current to AC current so as to drive a three-phase AC motor.

Heat generated from the circuit-element sections 2A to 2C, while the inverter circuit is operating, is transferred to the thermal radiation plate 3, which is bonded to the circuit-element sections 2A to 2C of the cooler 1, and is then transferred to the fin unit 5 provided under the thermal radiation plate 3.

The cooler 1 of the semiconductor-module S is connected to a pump (not shown) provided upstream side and the coolant inlet pipe 10, and the coolant outlet pipe 11 is connected to a heat exchanger provided downstream side of the coolant outlet pipe 11, thus implementing a coolant path in a closed loop including the pump and heat exchanger. The coolant is forcibly circulated by the pump in the closed-loop.

As illustrated in FIG. 3, the coolant introduced from the coolant inlet pipe 10 of the cooler 1 to the coolant inlet portion 14 by the above-described forced circulation in the closed-loop flows through the coolant introduction channel 16, the channels formed between the number of fins 20 of the fin unit 5, the coolant extraction channel 17, and the coolant outlet portion 15 and is then extracted through the coolant outlet pipe 11.

The heat from the circuit-element sections 2A to 2C transferred to the fin unit 5 is dissipated through the coolant passing through the channels formed between the number of fins 20 of the fin unit 5, so that the heated circuit-element sections 2A to 2C are cooled by the cooler 1.

The heat sink of the present invention corresponds to the fin unit 5, and the upper and lower surfaces of the heat sink correspond to the lower edges of the number of fins 20 fixed to the unit base 21 and the upper edges contacting to the inner surface 3a of the thermal radiation plate 3, respectively.

Next, an operation of the flow rate control plate 22 provided for the cooler 1 will be explained.

As illustrated in FIG. 3, the flow rate control plate 22 of the embodiment extends in the boundary between the coolant extraction channel 17 and the cooling channel 18. The flow rate control plate 22 is provided on the side close to the coolant outlet portion 15 and is not provided on the far side distant from the coolant outlet portion 15.

With such a structure, the coolant flowing from the coolant inlet pipe 10 through the coolant inlet portion 14 into the coolant introduction channel 16 tends to pass through the channels between some fins 20 of the fin unit 5 located in the side close to the coolant inlet portion 14 and to flow out to the side of the coolant extraction channel 17 close to the coolant outlet portion 15. However, the flow of the coolant flowing out to the coolant extraction channel 17 is regulated by the flow rate control plate 22 extending in the boundary between the coolant extraction channel 17 and the ends of the cooling channel 18, allocated in the side close to the coolant outlet portion 15.

In such a manner, the embodiment prevents uneven flow of the coolant in which specific flow rates of the coolant are higher in certain channels between some particular fins 20 of the fin unit 5, or the particular fins 20 of the fin unit 5 located in the near side close to the coolant inlet portion 14 as described above.

As illustrated in FIG. 4, in the flow rate control plate 22 of the embodiment, one of the flow rate increasing sections 22b is provided ends of the plurality of fins 20 under the circuit-element section 2A, which is illustrated on the left side of FIG. 4. Another one of the predetermined flow rate increasing sections 22b is provided at ends of the plurality of fins 20 under the circuit-element section 2B, which is illustrated on the second left side in FIG. 4.

In such a structure, the coolant flowing through the channels between the plurality of fins 20 located under the circuit-element section 2A on the far left does not slow down because of the presence of the flow rate increasing section 22b, so that the circuit-element section 2A on the far left is cooled efficiently. The coolant flowing through the channels between the plurality of fins 20 located under the circuit-element section 2B, located on the second left, also does not slow down because of the presence of the flow rate increasing section 22b. Accordingly, the circuit-element section 2B, located on the second left, is cooled efficiently.

Next, the effectiveness of the semiconductor-module S of the embodiment will be explained.

The flow rate control plate 22 of the cooler 1 of the embodiment extends in the boundary between the coolant extraction channel 17 and the end of the cooling channel 18 and is located on the side close to the coolant outlet portion 15 while not located in the far side distant from the coolant outlet portion 15. Accordingly, the coolants flown into the coolant introduction channel 16 flow from the starting side, or the side close to the coolant inlet portion 14, toward the terminating side, or the side distant from the coolant inlet portion 14, at appropriate flow rates and then flow through the channels between the number of fins 20 with uniformly distributed flow rates to exit into the coolant extraction channel 17. Accordingly, it is possible to achieve the semiconductor-module S having a capability of stably cooling the circuit-element sections 2A to 2C.

In the flow rate control plate 22 of the embodiment, one of the flow rate increasing sections 22*b* is provided at ends of a plurality of fins 20 provided under the circuit-element section 2A, and another one of the flow rate increasing sections 22*b* is located at ends of a plurality of fins 20 provided under the circuit-element section 2B. The coolants flowing thorough the channels between the plurality of fins 20 provided under the circuit-element sections 2A and 2B do not slow down because of the flow rate increasing sections 22*b*, thereby efficiently cooling the circuit-element sections 2A and 2B.

In the cooler 1 of the embodiment, the upper edges of the number of fins 20, which implement the fin unit 5, contact to the inner surface 3*a* of the thermal radiation plate 3, and the lower edges of the number of fins 20 contact to the bottom surface of the cooling jacket 4, interposing the unit base 21 between the fin unit 5 and the cooling jacket 4. Accordingly, the cooler 1 of the embodiment has high flexural rigidity and is not easily deformed even if vibration is externally transmitted to the cooler 1. The cooler 1 is therefore robust.

Even if the thermal radiation plate 3 and cooling jacket 4 are made thin, the number of fins 20 of the fin unit 5, which contact to the thermal radiation plate 3 and cooling jacket 4, are capable of holding the cooler 1 with a robust structure. Accordingly, the weight of the semiconductor-module S can be decreased.

The thermal radiation plate 3 and cooling jacket 4 made thinner have lower thermal resistance and more excellent radiation capability. The cooler 1 therefore has a higher cooling capability.

Next, a method for manufacturing the cooler 1 of the semiconductor-module S according to an embodiment of the present invention will be explained with reference to FIG. 5.

First, the unit base 21 is fixed to the lower surfaces of the number of fins 20, which are each bent to an identical corrugated profile, respectively, are arranged at predetermined intervals in the thickness direction to create the appearance of a cuboid structure, and are supported by a fin supporting member (not shown). The flow rate control plate 22 is bonded by brazing to the edges of the number of fins 20, which are arranged to create the appearance of a cuboid structure, so as to extend along one of the long sides of the cuboid structure. Accordingly, the fin unit 5 is formed.

Subsequently, the unit base 21 of the fin unit 5 is bonded by brazing to the region of the cooling channel 18 of the cooling jacket 4. By bonding the fin unit 5 to the cooling channel 18, the channels formed between the number of fins 20 of the fin unit 5 communicate with the coolant introduction channel 16 and the coolant extraction channel 17 of the cooling jacket 4 so as to be substantially orthogonal to the coolant introduction channel 16 and the coolant extraction channel 17.

Next, the joint face 12 provided around the entire outer circumference so as to surround the opening of the cooling jacket 4, in which the fin unit 5 is bonded to the cooling channel 18, is bonded by brazing to the lower surface of the thermal radiation plate 3, on the outer surface of which the plurality of circuit-element sections 2A to 2C are provided.

The cooler 1 is thereby formed so that the coolant inlet pipe 10 connected to the thermal radiation plate 3 communicates with the coolant inlet portion 14 while the coolant outlet pipe 11 communicates with the coolant outlet portion 15 and that the fin unit 5 is sealed between the cooling jacket 4 and thermal radiation plate 3 which are integrated with each other.

Next, an effectiveness of the method for manufacturing the cooler 1 of the semiconductor-module S of the embodiment will be explained.

The method for manufacturing the cooler 1 of the semiconductor-module S of the embodiment uses the fin unit 5 in which the flow rate control plate 22 is integrated with the fins 20. The number of parts is therefore decreased, and the cooler 1 is manufactured by a simple manufacturing process. The manufacturing cost of the cooler 1 is therefore decreased.

Because the flow rate control plate 22, which is bonded to the ends of the array of the number of fins 20, the fins 20 are arranged to create the appearance of a cuboid structure, by extending along one of the long sides of the cuboid structure, determines the width of the channels between the plurality of fins 20 to predetermined values, the flow rates of the coolants flowing between the fins 20 can be controlled to appropriate values.

The aforementioned fins 20 of the fin unit 5 can have various types of shapes conventionally known. The fins 20 act as a resistance to the coolant flowing through the cooling channel 18 and are desirably provided so as to decrease the pressure loss of the coolant. Preferably, the shape and dimensions of the fins 20 are properly provided in consideration of the conditions for introducing the coolant 1 (the pump capability and the like), the kinds of the coolant (viscosity and the like), and the amount of heat to be removed, and the like. In the embodiment, the number of fins 20 are arranged to create the appearance of a cuboid structure but may be arranged into any profile that is obtained by chamfering or deforming the cuboid structure without decreasing the effectiveness of the present invention.

Next, with reference FIG. 6, an electrically-driven vehicle including the semiconductor-module according to an embodiment of the present invention will be explained.

An electrically-driven vehicle 50 includes at least: the semiconductor-module S, a motor 37 driven by electric power provided by the semiconductor-module S, a central processing unit 38 controlling the semiconductor-module S, a pump 39 transporting coolants for cooling the semiconductor-module S, a heat exchanger 40 cooling the coolants, and a tube 41 which connects the cooer 1 integrated with the semiconductor-module S, pump 39, and heat exchanger 40 in a closed loop to form coolant paths.

The motor 37 rotates wheels 36 using a mechanism mechanically transmitting driving force to the wheels 36.

In the electrically-driven vehicle employing the semiconductor-module of the present invention, the heat sink 5 and flow rate control plate 22 are integrated and then housed in the cooling jacket 4. Accordingly, the semiconductor-module of the present invention is more compact and is manufactured at lower cost than conventional semiconductor-modules. Moreover, the upper and lower surfaces of the heat sink 5 facing the inner surfaces of the cooling jacket 4 and the inner surface of the thermal radiation plate 3 contact to the inner surfaces of the cooling jacket 4 and the thermal radiation plate 3. Accordingly, the cooler has high rigidity and is resistant to vibration due to movement of the electrically-driven vehicle.

INDUSTRIAL APPLICABILITY

As described above, the method for manufacturing a semiconductor-module cooler according to the present invention is useful for the methods capable of decreasing the manufacturing cost while providing stable cooling capability. Moreover, the semiconductor-module cooler, the semiconductor-module, and the electrically-driven vehicle according to the present invention are useful for the semiconductor-module cooler, the semiconductor-module, and the electrically-driven vehicle that provide stable cooling capability and are lightweight.

REFERENCE SIGNS LIST

1 . . . COOLER, 2A TO 2C . . . CIRCUIT-ELEMENT SECTION, 3 . . . THERMAL RADIATION PLATE, 3A . . . INNER SURFACE OF THERMAL RADIATION PLATE, 4 . . . COOLING JACKET, 5 . . . FIN UNIT (HEAT SINK), 10 . . . COOLANT INLET PIPE, 11 . . . COOLANT OUTLET PIPE, 12 . . . JOINT FACE, 14 . . . COOLANT INLET PORTION, 15 . . . COOLANT OUTLET PORTION, 16 . . . COOLANT INTRODUCTION CHANNEL, 17 . . . COOLANT EXTRACTION CHANNEL, 18 . . . COOLING CHANNEL, 20 . . . FIN, 21 . . . UNIT BASE, 22 . . . FLOW RATE CONTROL PLATE, 22A . . . FLOW RATE DECREASING SECTION, 22A . . . FLOW RATE INCREASING SECTION, 31 . . . SUBSTRATE, 31A . . . INSULATING SUBSTRATE, 31B, 31C . . . CONDUCTOR PATTERN, 32, 33 . . . SEMICONDUCTOR DEVICE, 34, 35 . . . JOINT LAYER, 36 . . . WHEEL, 37 . . . MOTOR, 38 . . . CENTRAL PROCESSING UNIT, 39 . . . PUMP, 40 . . . HEAT EXCHANGER, 41 . . . TUBE, 50 . . . ELECTRICALLY-DRIVEN VEHICLE, S . . . SEMICONDUCTOR MODULE

The invention claimed is:

1. A method for manufacturing a cooler for a semiconductor module, the cooler including: a heat sink having an appearance of a cuboid structure; a heat radiation plate to which a semiconductor device is bonded; and a tray-shaped cooling jacket including: a coolant introduction channel to introduce a coolant through a coolant inlet portion; a coolant extraction channel to extract the coolant to a coolant outlet portion, the coolant extraction channel extending in parallel to the coolant introduction channel; and a cooling channel between the coolant introduction and extraction channels, the method comprising:
fixing a flow rate control plate to one side of the heat sink;
arranging the heat sink in the cooling channel of the cooling jacket so that the flow rate control plate extends longitudinally along a boundary between the coolant extraction channel and the cooling channel in a direction parallel to the coolant extraction channel, and so that the flow rate control plate extends across a plurality of channels provided for the heat sink which extend orthogonally to the coolant introduction and extraction channels; and
bonding the heat radiation plate so as to close an opening of the cooling jacket.

2. A method for manufacturing a cooler for a semiconductor module, the cooler including: a heat sink having an appearance of a cuboid structure; a heat radiation plate to which a semiconductor device is bonded; and a tray-shaped cooling jacket including: a coolant introduction channel to introduce a coolant through a coolant inlet portion; a coolant extraction channel to extract the coolant to a coolant outlet portion, the coolant extraction channel extending in parallel to the coolant introduction channel; and a cooling channel between the coolant introduction and extraction channels, the method comprising:
fixing a flow rate control plate to one side of the heat sink;
arranging the heat sink in the cooling channel of the cooling jacket so that the flow rate control plate extends in a boundary between the coolant extraction channel and the cooling channel, and a plurality of channels provided for the heat sink extend orthogonally to the coolant introduction and extraction channels; and
bonding the heat radiation plate so as to close an opening of the cooling jacket, wherein the flow rate control plate includes:
a flow rate decreasing section standing from a lower edge of the heat sink to a first height below an upper edge of the heat sink; and
a flow rate increasing section having a second height from the lower edge of the heat sink which is lower than that of the flow rate decreasing section.

3. The method of claim 1, wherein one end of the flow rate control plate is fixed to the heat sink at a location next to the coolant outlet portion.

4. The method of claim 1, wherein the flow rate control plate has a shape that increases a flow rate of the coolant flowing through the plurality of channels of the heat sink below a part of the heat radiation plate to which the semiconductor device is bonded.

5. The method of claim 1, wherein
the heat sink includes a plurality of fins arranged at predetermined intervals in a thickness direction of the fins,
each of the plurality of channels provided for the heat sink is provided between adjacent fins among the plurality of fins, and
the flow rate control plate is fixed to the plurality of fins arranged at the predetermined intervals.

6. A cooler for a semiconductor module, comprising:
a heat sink having an appearance of a cuboid structure to one side of which a flow rate control plate is fixed;
a heat radiation plate, to which a semiconductor device is bonded; and
a tray-shaped cooling jacket including:
a coolant introduction channel to introduce a coolant through a coolant inlet portion,
a coolant extraction channel to extract the coolant to a coolant outlet portion, the coolant extraction channel extending in a direction parallel to the coolant introduction channel, and
a cooling channel provided between the coolant introduction and extraction channels,
wherein
the heat sink is arranged in the cooling channel of the cooling jacket so that the flow rate control plate extends longitudinally along a boundary between the coolant extraction channel and the cooling channel in the direction parallel to the coolant introduction channel,
a plurality of channels provided for the heat sink extend orthogonally to the coolant introduction channel and the coolant extraction channel and the flow rate control plate extends across the plurality of channels,
the heat radiation plate is fixed so as to close an opening of the cooling jacket, an upper surface of the heat sink faces and is contact with an inner surface of the heat radiation plate, and a lower surface of the heat sink faces and is in contact with an inner surface of the cooling jacket.

7. A cooler for a semiconductor module, comprising:

a heat sink having an appearance of a cuboid structure to one side of which a flow rate control plate is fixed;

a heat radiation plate, to which a semiconductor device is bonded; and a tray-shaped cooling jacket including:
  a coolant introduction channel to introduce a coolant through a coolant inlet portion,
  a coolant extraction channel to extract the coolant to a coolant outlet portion, the coolant extraction channel extending in a direction parallel to the coolant introduction channel, and
  a cooling channel provided between the coolant introduction and extraction channels, wherein the heat sink is arranged in the cooling channel of the cooling jacket so that the flow rate control plate extends in a boundary between the coolant extraction channel and the cooling channel, a plurality of channels provided for the heat sink extend orthogonally to the coolant introduction channel and the coolant extraction channel, the heat radiation plate is fixed so as to close an opening of the cooling jacket, an upper surface of the heat sink faces and is contact with an inner surface of the heat radiation plate, a lower surface of the heat sink faces and is in contact with an inner surface of the cooling jacket, and the flow rate control plate includes:
  a flow rate decreasing section standing from a lower edge of the heat sink to a first height below an upper edge of the heat sink, and
  a flow rate increasing section having a second height from the lower edge of the heat sink which is lower than that of the flow rate decreasing section.

8. The cooler of claim 6, wherein one end of the flow rate control plate is fixed to the heat sink at a location next to the coolant outlet portion.

9. The cooler of claim 6, wherein the flow rate control plate has a shape that increases a flow rate of the coolant flowing through the plurality of channels of the heat sink below a part of the heat radiation plate to which the semiconductor device is bonded.

10. The cooler of claim 6, wherein
the heat sink includes a plurality of fins arranged at predetermined intervals in a thickness direction of the fins, each of the plurality of channels provided for the heat sink is provided between adjacent fins among the plurality of fins, and the flow rate control plate is fixed to the plurality of fins arranged at the predetermined intervals.

11. A semiconductor module, comprising:

a cooler externally supplied with a coolant, configured to cool a semiconductor device provided on an outer side of the cooler, the cooler including:

a heat sink having an appearance of a cuboid structure to one side of which a flow rate control plate is fixed, a heat radiation plate, to which a semiconductor device is bonded, and a tray-shaped cooling jacket including:
  a coolant introduction channel to introduce a coolant through a coolant inlet portion,
  a coolant extraction channel to extract the coolant to a coolant outlet portion, the coolant extraction channel extending in a direction parallel to the coolant introduction channel, and
  a cooling channel between the coolant introduction and extraction channels, wherein the heat sink is arranged in the cooling channel of the cooling jacket so that the flow rate control plate extends longitudinally along a boundary between the coolant extraction channel and the cooling channel in the direction parallel to the coolant introduction channel, a plurality of channels provided for the heat sink extend orthogonally to the coolant introduction channel and the coolant extraction channel and the flow rate control plate extends across the plurality of channels, the heat radiation plate is fixed so as to close an opening of the cooling jacket, an upper surface of the heat sink faces and is in contact with an inner surface of the heat radiation plate, and a lower surface of the heat sink faces and is in contact with an inner surface of the cooling jacket.

12. An electrically-driven vehicle, comprising:
the semiconductor module according to claim 11;
a motor driven by electric power provided by the semiconductor module;
a central processing unit to control the semiconductor module;
a pump to transport the coolant to cool the semiconductor module;
a heat exchanger to cool the coolant; and
a tube forming a coolant path, connecting the semiconductor module, the pump, and the heat exchanger in a closed loop, which are integrated with the cooler.

13. The method of claim 1, wherein the flow rate control plate is fixed to only one side of the heat sink.

14. The method of claim 1, wherein the heat sink includes:
a base,
a plurality of fins, each extending longitudinally in a direction perpendicular to the direction parallel to the coolant extraction channel and spaced apart from one another in the direction parallel to the coolant extraction channel, to protrude upward from the base, and the flow rate control plate, fixed to one side of the plurality of fins and extending longitudinally in the direction parallel to the coolant extraction channel, to protrude upward from the base.

15. The method of claim 14, wherein the plurality of fins have a corrugated profile.

* * * * *